(12) United States Patent
Spengler et al.

(10) Patent No.: US 7,727,004 B2
(45) Date of Patent: Jun. 1, 2010

(54) TESTING A HIGH SPEED SERIAL BUS WITHIN A PRINTED CIRCUIT BOARD

(75) Inventors: David Louis Spengler, Colorado Springs, CO (US); Bill A. Pagano, Colorado Springs, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 419 days.

(21) Appl. No.: 11/480,087

(22) Filed: Jun. 30, 2006

(65) Prior Publication Data

US 2008/0003884 A1 Jan. 3, 2008

(51) Int. Cl.
*G01R 27/02* (2006.01)
(52) U.S. Cl. .................. 439/482; 324/73.1
(58) Field of Classification Search ............. 439/482; 324/73.1, 72.5, 761, 754; 174/262, 266
See application file for complete search history.

(56) References Cited

U.S. PATENT DOCUMENTS

| | | | | |
|---|---|---|---|---|
| 3,975,680 | A * | 8/1976 | Webb | 324/686 |
| 4,998,240 | A | 3/1991 | Williams | |
| 5,189,663 | A | 2/1993 | Williams | |
| 5,239,448 | A * | 8/1993 | Perkins et al. | 361/764 |
| 5,357,051 | A * | 10/1994 | Hwang | 174/33 |
| 5,379,189 | A * | 1/1995 | Merriman | 361/760 |
| 5,646,368 | A * | 7/1997 | Muyshondt et al. | 174/33 |
| 5,717,556 | A * | 2/1998 | Yanagida | 361/803 |
| 5,726,541 | A | 3/1998 | Glenn et al. | |
| 6,012,148 | A | 1/2000 | Laberge et al. | |
| 6,154,370 | A * | 11/2000 | Degani et al. | 361/761 |
| 6,266,789 | B1 | 7/2001 | Bucher et al. | |
| 6,393,587 | B2 | 5/2002 | Bucher et al. | |
| 6,456,502 | B1 * | 9/2002 | Miller et al. | 361/760 |
| 6,493,656 | B1 | 12/2002 | Houston et al. | |
| 6,521,843 | B1 * | 2/2003 | Kohya | 174/255 |
| 6,540,527 | B1 * | 4/2003 | Tamarkin | 439/67 |
| 6,717,485 | B2 * | 4/2004 | Kolb et al. | 333/12 |
| 6,819,287 | B2 | 11/2004 | Sullivan et al. | |
| 6,937,480 | B2 * | 8/2005 | Iguchi et al. | 361/780 |
| 6,981,181 | B2 | 12/2005 | Dun et al. | |
| 7,020,801 | B2 | 3/2006 | Dun et al. | |
| 7,025,628 | B2 * | 4/2006 | LaMeres et al. | 439/502 |
| 7,185,427 | B2 * | 3/2007 | Willard et al. | 29/842 |
| 7,294,007 | B1 * | 11/2007 | Lawlyes et al. | 439/276 |
| 7,435,912 | B1 * | 10/2008 | Alexander et al. | 174/262 |
| 2002/0174293 | A1 | 11/2002 | Fox et al. | |
| 2003/0105607 | A1 | 6/2003 | Jones et al. | |
| 2004/0250191 | A1 | 12/2004 | Leaming | |
| 2005/0097403 | A1 | 5/2005 | Chen | |
| 2005/0102592 | A1 | 5/2005 | Jones et al. | |
| 2005/0111650 | A1 | 5/2005 | Baratz et al. | |
| 2005/0149800 | A1 | 7/2005 | Jones et al. | |
| 2006/0010349 | A1 | 1/2006 | Dun et al. | |
| 2006/0053344 | A1 | 3/2006 | Dun et al. | |

\* cited by examiner

*Primary Examiner*—Neil Abrams
(74) *Attorney, Agent, or Firm*—Fellers, Snider, et al.

(57) ABSTRACT

An apparatus and associated method for analyzing a communications link between two components on a common PCB. The communications link has a pair of through-board conductors connected by a first conductive etching on one side of the PCB. The communications link further has second etchings on an opposite side of the PCB respectively connecting each of the through-board conductors to one of the components. The first conductive etching can operably be open-circuited and connectors of an analyzer can be fitted to the through-board conductors to test the communications link between the components.

15 Claims, 6 Drawing Sheets

TESTING A HIGH SPEED SERIAL BUS WITHIN A PRINTED CIRCUIT BOARD

FIELD OF THE INVENTION

The claimed invention relates generally to the field of printed circuit board (PCB) testing and more particularly, but not by way of limitation, to an apparatus and method for readily and inexpensively connecting a bus protocol analyzer to a high speed serial bus that is self-contained within a PCB.

BACKGROUND

Computer networking began proliferating when the data transfer rates of industry standard architectures could not keep pace with the data access rate of the 80386 processor made by Intel Corporation. Local area networks (LANs) evolved to storage area networks (SANs) by consolidating the data storage capacity in the network. Users have realized significant benefits by the consolidation of equipment and the associated data handled by the equipment in SANs, such as the capability of handling an order of magnitude more storage than would otherwise be possible with direct attached storage, and doing so at manageable costs.

More recently the movement has been toward a network-centric approach to controlling the data storage subsystems. That is, in the same way that the storage was consolidated, so too are the systems that control the functionality of the storage being offloaded from the servers and into the network itself. Host-based software, for example, can delegate maintenance and management tasks to intelligent switches or to a specialized network storage services platform. Appliance-based solutions eliminate the need for the software running in the hosts, and operate within computers placed as a node in the enterprise. In any event, the intelligent network solutions can centralize such things as storage allocation routines, backup routines, and fault tolerance schemes independently of the hosts.

While moving the intelligence from the hosts to the network resolves some problems such as these, it does not resolve the inherent difficulties associated with the general lack of flexibility in altering the presentation of virtual storage to the hosts. For example, stored data may need to be moved for reliability concerns, or more storage capacity may need to be added to accommodate a growing network. In these events either the host or the network must be modified to make it aware of the existence of the new or changed storage space.

Intelligent data storage subsystems self-deterministically allocate, manage, and protect its respective data storage capacity, and presents that capacity as a virtual storage space to the network to accommodate global storage requirements. This virtual storage space is able to be provisioned into multiple storage volumes. A distributed computing environment uses these intelligent storage devices for global provisioning as well as for global sparing in the event of failures.

As more intelligence and related intelligent components migrate to the data storage subsystem, it is not unusual for a single printed circuit board (PCB) to contain two or more processors executing software modules. Whereas these processors were in the past located on different PCBs, it was then a rather straightforward ordeal to connect a bus protocol analyzer to the PCB in order to analyze the functionality of the processor. However, where two or more processors are connected together within the same PCB, such an analysis can be problematic.

What is needed are improvements making it possible to readily and inexpensively connect a bus analyzer to a high speed communications bus connecting two or more components in a common PCB. It is to this solution that embodiments of the present invention are directed.

SUMMARY OF THE INVENTION

Embodiments of the present invention are generally directed to an apparatus and associated methodology for testing a self-contained high speed serial bus on a PCB.

In some embodiments a communications link is provided between two components on a common PCB. The communications link has a pair of through-board conductors connected by a first conductive etching on one side of the PCB. The communications link further has second etchings on an opposite side of the PCB respectively connecting each of the through-board conductors to one of the components.

In some embodiments a method provides testing of components on a PCB by a communications link having a pair of through-board conductors that are conductively connected by a first etching on one side of the PCB, and having a pair of etchings on an opposite side of the PCB conductively connecting each of the through-board conductors to one of the components. The method also provides for connecting an analyzer to the through-board conductors.

In some embodiments a device is provided having a PCB with a high speed serial bus and means for connecting an analyzer to a medial portion of the high speed serial bus.

These and various other features and advantages which characterize the claimed invention will become apparent upon reading the following detailed description and upon reviewing the associated drawings.

DETAILED DESCRIPTION

Figure 1:
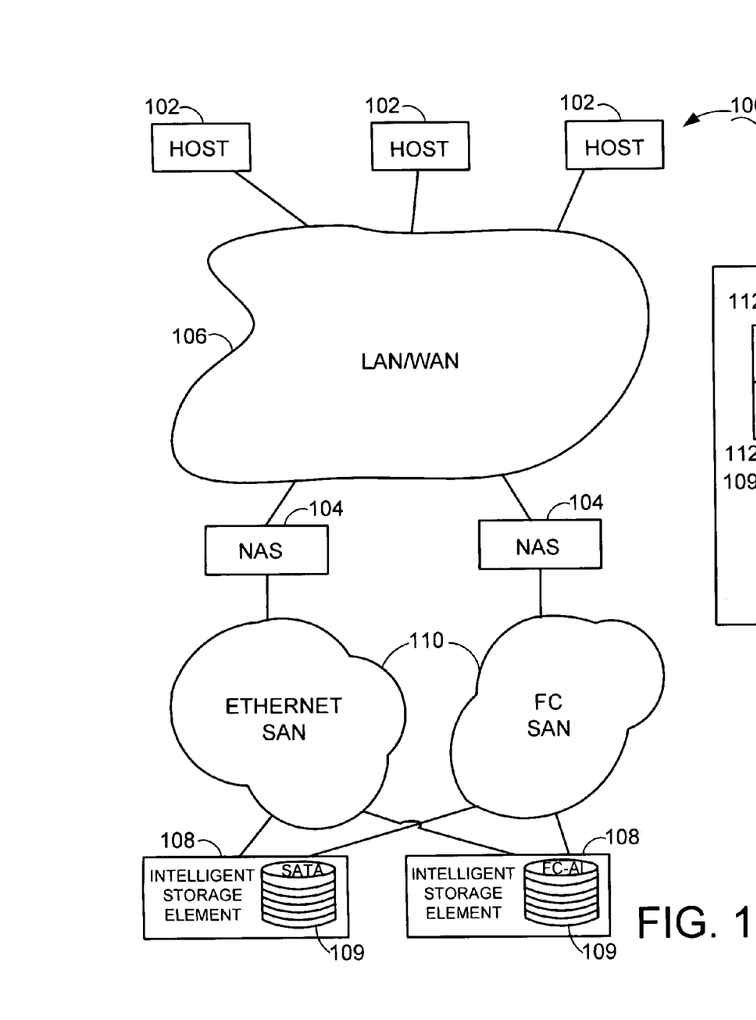
FIG. 1 is a diagrammatic representation of a computer system in which embodiments of the present invention are useful.

FIG. 1 is an illustrative computer system 100 in which embodiments of the present invention are useful. One or more hosts 102 are networked to one or more network-attached servers 104 via a local area network (LAN) and/or wide area network (WAN) 106. Preferably, the LAN/WAN 106 uses Internet protocol (IP) networking infrastructure for communicating over the World Wide Web. The hosts 102 access applications resident in the servers 104 that routinely need data stored on one or more of a number of intelligent storage elements ("ISEs") 108. Accordingly, SANs 110 connect the servers 104 to the ISEs 108 for access to the stored data. The ISEs 108 provide blocks of data storage capacity 109 for storing the data over various selected communication protocols such as serial ATA and fibre-channel, with enterprise or desktop class storage medium within it.

Figure 2:
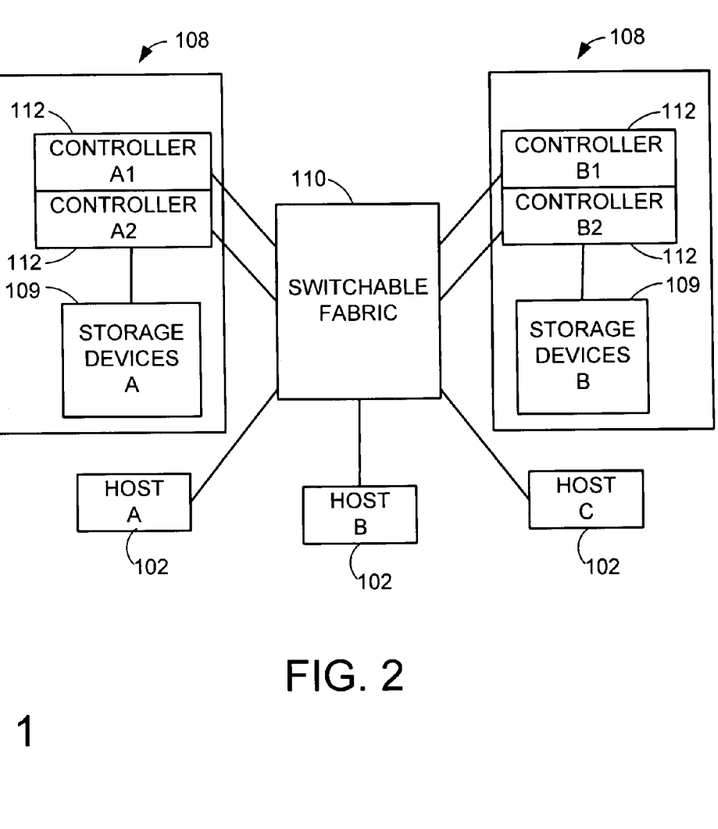
FIG. 2 is a simplified diagrammatic representation of the computer system of FIG. 1.

FIG. 2 is a simplified diagrammatic view of the computer system 100 of FIG. 1. The hosts 102 interact with each other as well as with a pair of the ISEs 108 (denoted A and B, respectively) via the network or fabric 110. Each ISE 108 includes dual redundant controllers 112 (denoted A1, A2 and B1, B2) preferably operating on the data storage capacity 109 as a set of data storage devices characterized as a redundant array of independent drives (RAID). The controllers 112 and data storage capacity 109 preferably utilize a fault tolerant arrangement so that the various controllers 112 utilize parallel, redundant links and at least some of the user data stored by the system 100 is stored in redundant format within at least one set of the data storage capacities 109.

It is further contemplated that the A host computer 102 and the A ISE 108 can be physically located at a first site, the B host computer 102 and B ISE 108 can be physically located at a second site, and the C host computer 102 can be yet at a third site, although such is merely illustrative and not limiting. All entities on the distributed computer system are connected over some type of computer network.

Figure 3:
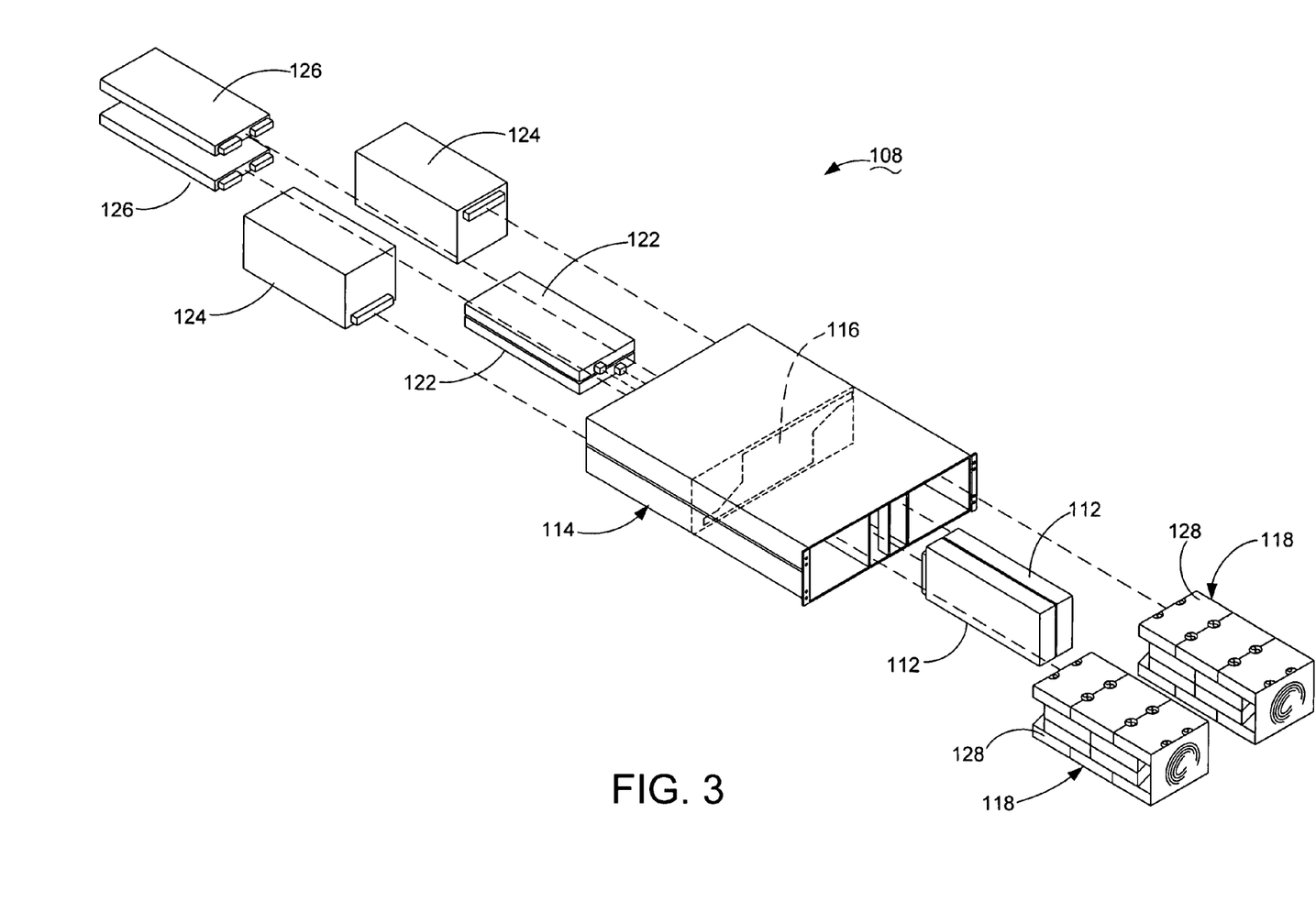
FIG. 3 is an exploded isometric view of an intelligent storage element constructed in accordance with embodiments of the present invention.

FIG. 3 illustrates an ISE 108 constructed in accordance with embodiments of the present invention. A shelf 114 defines cavities for receivingly engaging the controllers 112 in electrical connection with a midplane 116. The shelf 114 is supported, in turn, within a cabinet (not shown). A pair of multiple disc assemblies (MDAs) 118 are receivingly engageable with the shelf 114 on the same side of the midplane 116. Connected to the opposing side of the midplane 116 are dual batteries 122 providing an emergency power supply, dual alternating current power supplies 124, and dual interface modules 126. Preferably, the dual components are configured for operating either of the MDAs 118 or both simultaneously, thereby providing backup protection in the event of a component failure.

Figure 4:
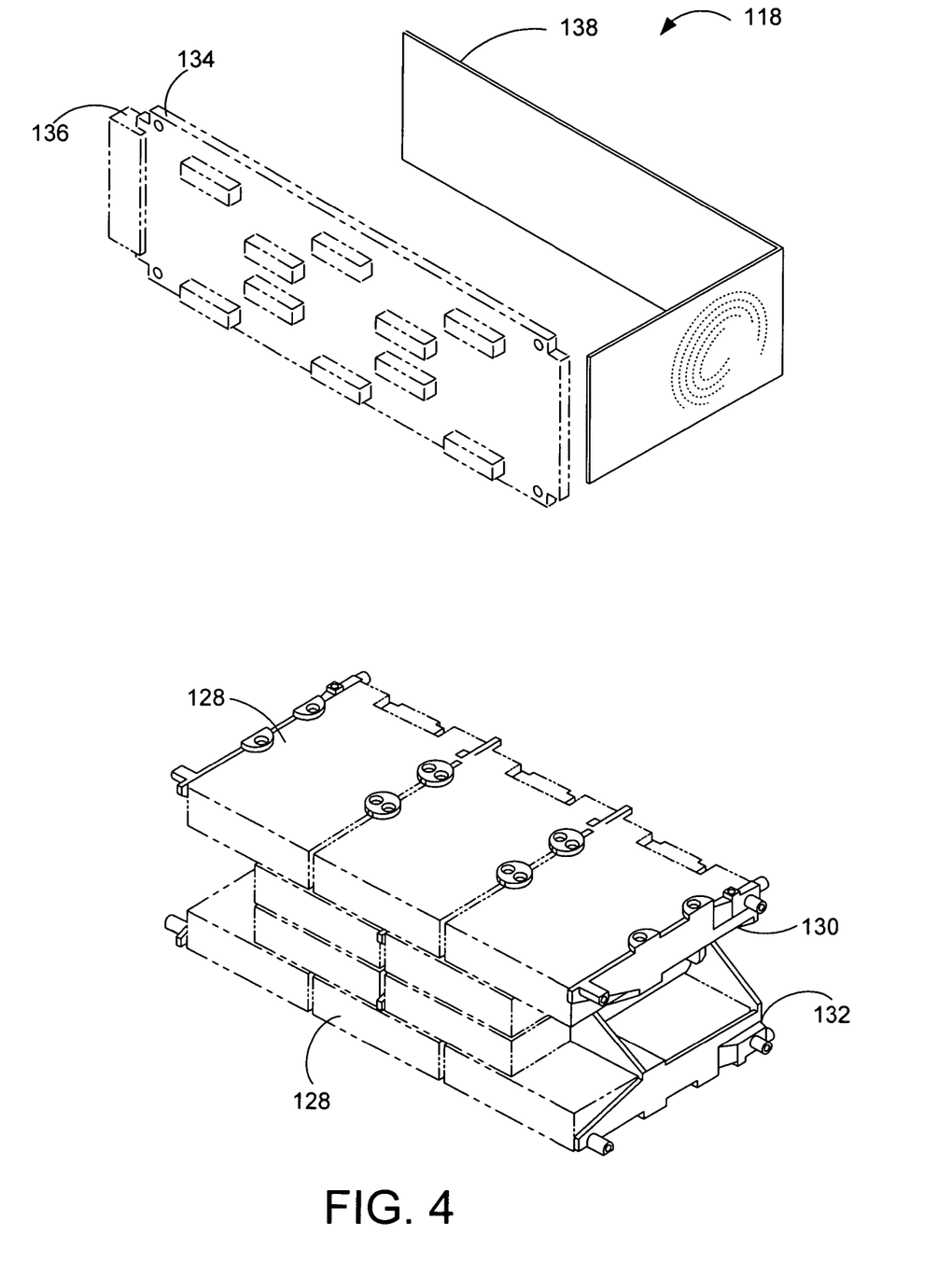
FIG. 4 is a partially exploded isometric view of a multiple disc array of the intelligent storage element of FIG. 3.

FIG. 4 is an enlarged partially exploded isometric view of an MDA 118 constructed in accordance with some embodiments of the present invention. The MDA 118 has an upper partition 130 and a lower partition 132, each supporting five data storage devices 128. The partitions 130, 132 align the data storage devices 128 for connection with a common circuit board 134 having a connector 136 that operably engages the midplane 116 (FIG. 3). A wrapper 138 provides electromagnetic interference shielding. This illustrative embodiment of the MDA 118 is the subject matter of patent application Ser. No. 10/884,605 entitled Carrier Device and Method for a Multiple Disc Array which is assigned to the assignee of the present invention and incorporated herein by reference. Another illustrative embodiment of the MDA is the subject matter of patent application Ser. No. 10/817,378 of the same title which is also assigned to the assignee of the present invention and incorporated herein by reference. In alternative equivalent embodiments the MDA 118 can be provided within a sealed enclosure.

Figure 5:
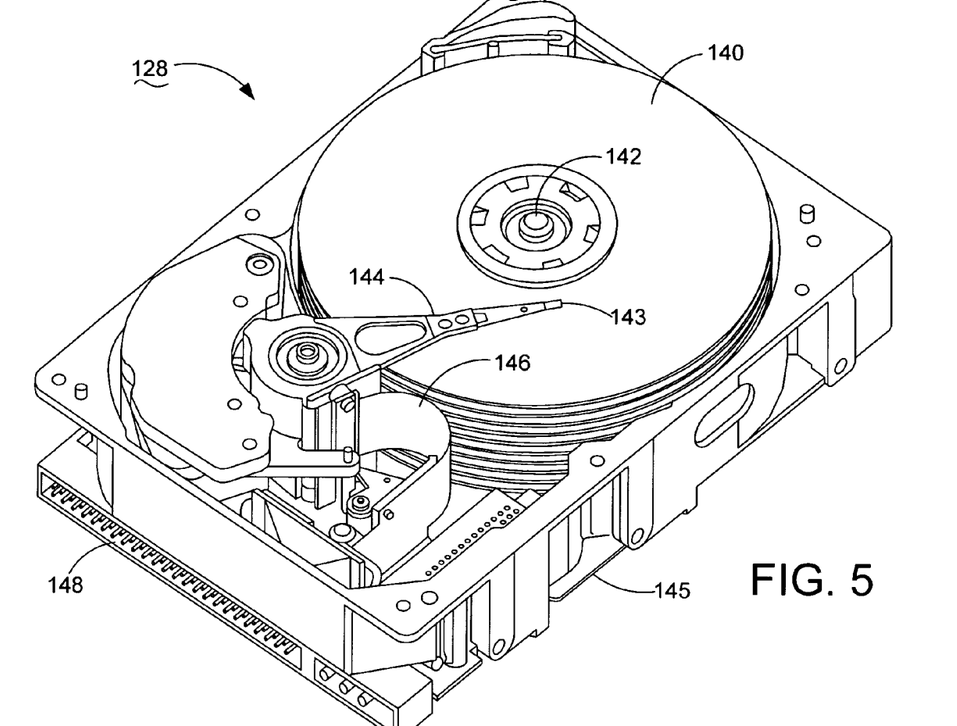
FIG. 5 is an exemplary data storage device used in the multiple disc array of FIG. 4.

FIG. 5 is an isometric view of an illustrative data storage device 128 suited for use with embodiments of the present invention and in the form of a rotating media disc drive. Although a rotating spindle with moving data storage medium is used for discussion purposes below, in alternative equivalent embodiment a non-rotating medium device, such as a solid state memory device is used. A data storage disc 140 is rotated by a motor 142 to present data storage locations of the disc 140 to a read/write head ("head") 143. The head 143 is supported at the distal end of a rotary actuator 144 that is capable of moving the head 143 radially between inner and outer tracks of the disc 140. The head 143 is electrically connected to a circuit board 145 by way of a flex circuit 146. The circuit board 145 is adapted to receive and send control signals controlling the functions of the data storage device 128. A connector 148 is electrically connected to the circuit board 145, and is adapted for connecting the data storage device 128 with the circuit board 134 (FIG. 4) of the MDA 118.

Figure 6:
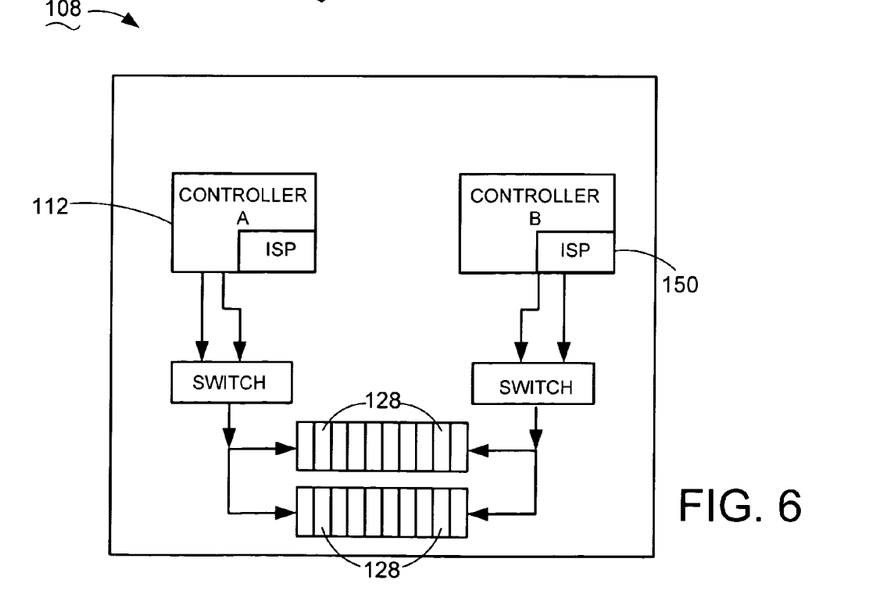
FIG. 6 is a functional block diagram of the intelligent storage element of FIG. 3.

FIG. 6 is a diagrammatic view of an ISE 108 constructed in accordance with embodiments of the present invention. The controllers 112 operate in conjunction with intelligent storage processors (ISPs) 150 to provide managed reliability of the data integrity. The ISPs 150 can be resident in the controller 112, in the MDA 118, or elsewhere within the ISE 108.

Aspects of the managed reliability include invoking reliable data storage formats such as RAID strategies. For example, by providing a system for selectively employing a selected one of a plurality of different RAID formats creates a relatively more robust system for storing data, and permits optimization of firmware algorithms that reduce the complexity of software used to manage the MDA 118, as well as resulting in relatively quicker recovery from storage fault conditions. These and other aspects of this multiple RAID format system is described in patent application Ser. No. 10/817,264 entitled Storage Media Data Structure and Method which is assigned to the present assignee and incorporated herein by reference.

Managed reliability can also include scheduling of diagnostic and correction routines based on a monitored usage of the system. Data recovery operations are executed for copying and reconstructing data. The ISP 150 is integrated with the MDAs 118 in such as way to facilitate "self-healing" of the overall data storage capacity without data loss. These and other aspects of the managed reliability aspects contemplated herein are disclosed in patent application Ser. No. 10/817,617 entitled Managed Reliability Storage System and Method which is assigned to the present assignee and incorporated herein by reference. Other aspects of the managed reliability include responsiveness to predictive failure indications in relation to predetermined rules, as disclosed for example in patent application Ser. No. 11/040,410 entitled Deterministic Preventive Recovery From a Predicted Failure in a Distributed Storage System which is assigned to the present assignee and incorporated herein by reference.

Figure 7:
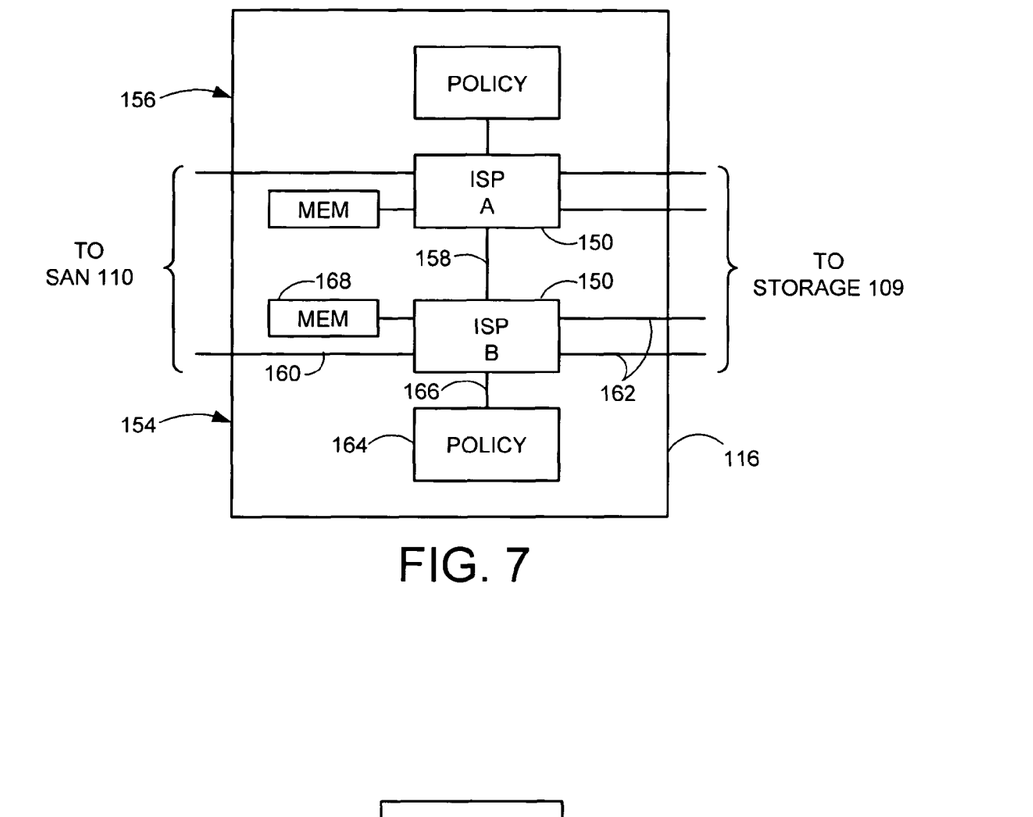
FIG. 7 is a functional block diagram of a portion of the midplane of the intelligent storage element of FIG. 3.

FIG. 7 is a diagrammatic illustration of a portion of the midplane 116 (FIG. 3), which has a pair of redundant ISPs 150 mounted to the same PCB. The ISP 150 interfaces the data storage capacity 109 to the SAN fabric 110. Each ISP 150 can manage assorted storage services such as routing, volume management, and data migration and replication. The ISPs 150 divide the board 152 into two ISP subsystems 154, 156 coupled by a high speed serial bus 158. The ISP subsystem 154 includes the ISP 150 denoted "B" which is connected to the fabric 110 and the storage capacity 109 by links 160, 162, respectively. The ISP subsystem 154 also includes a policy processor 164 executing a real-time operating system. The ISP 150 and policy processor 164 communicate over high speed serial bus 166, and both communicate with memory 168.

Figure 8:
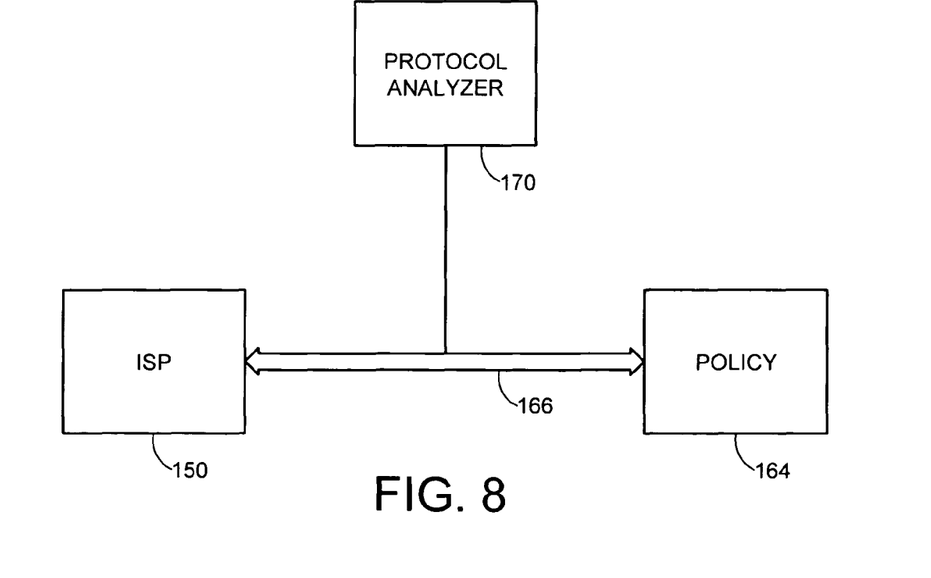
FIG. 8 is a diagrammatic depiction of a bus analyzer connected to a high speed communications link of the midplane of FIG. 7 in accordance with embodiments of the present invention.

FIG. 8 diagrammatically depicts the purpose of the present embodiments being to permit ready and inexpensive connection of a bus protocol analyzer 170 in a high speed serial bus connecting two components, such as for example in the bus 166 connecting the ISP 150 and the policy processor 164.

Figure 9:
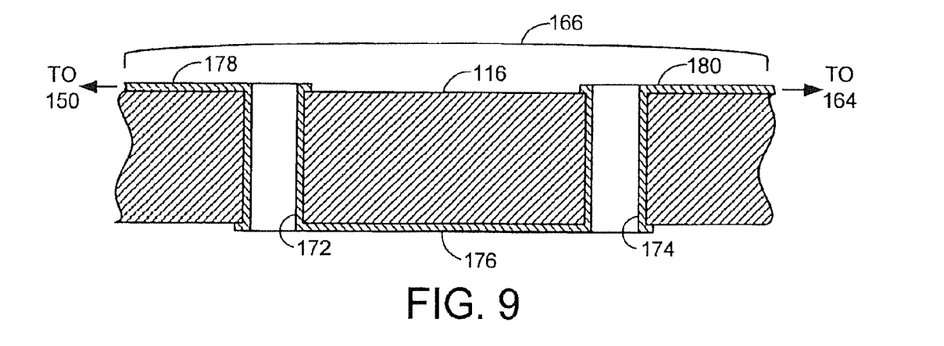
FIG. 9 is an enlarged cross sectional detail view of the high speed communications link of FIG. 8.

FIG. 9 is an enlarged cross sectional detail of a portion of the bus 166 showing a communications link constructed in accordance with embodiments of the present invention. The communications link is built upon the PCB 116, having a pair of through-board conductors such as conductive vias 172, 174 in the illustrative embodiments of FIG. 9. In equivalent alternative embodiments the through-board conductors can be differently constructed, such as but not limited to being constructed of conductive pads, terminals, and the like. The vias 172, 174 are connected by a conductive etching 176 disposed on one side of the PCB 116. Etchings 178, 180 disposed on an opposing side of the PCB 116 connect each of the vias 172, 174 to one of the components 150, 164.

This arrangement provides an operably stable communications link that is suited for high speed serial communications, such as on the order of one gigabits per second or more, such as in communications that are conducted between the operating system module of the policy processor 164 and the ISP 150.

Figure 10:
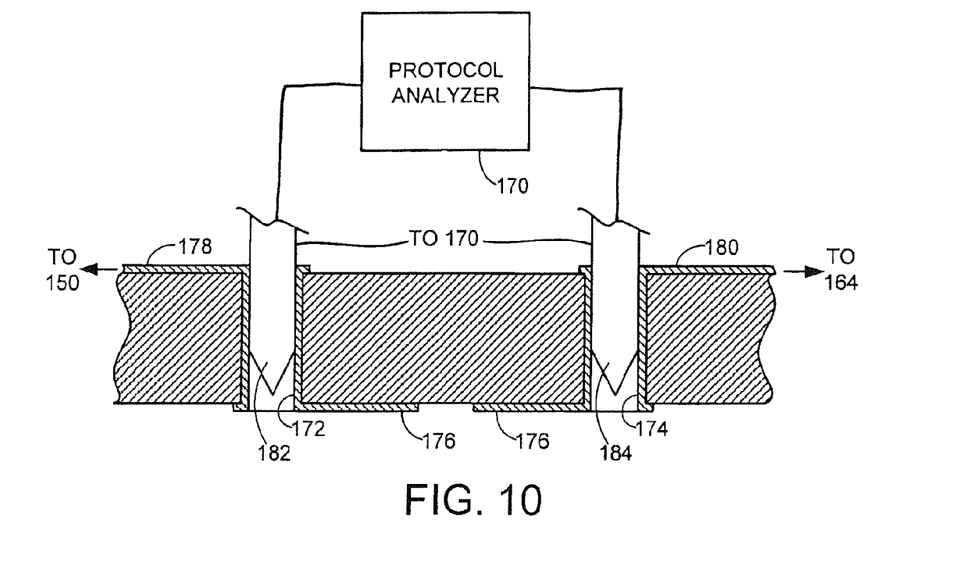
FIG. 10 is a view similar to FIG. 9 but with the bus analyzer connected to the high speed communications link.

However, for system analysis FIG. 10 shows the bus protocol analyzer 170 being connected into the serial bus 166. In these illustrative embodiments the bus protocol analyzer 170 has a connector with pins 182, 184 that matingly engage the vias 172, 174. If it is advantageous to isolate the components that are connected by the bus, then the conductive etching 176 can be disabled, such as by open-circuiting it as shown. This can be straightforwardly done by cutting or chemically dissolving a portion of the etching 176. This open-circuiting can be done in an appropriate size and/or in multiple locations with respect to the etching 176 to minimize stubbing effects to the communication link. The open-circuiting can also be accomplished by back drilling leading portions of the vias 172, 174 from the etching 176 side.

Summarizing generally, present embodiments contemplate a communications link (such as 166) between two components (such as 150, 164) on a common PCB (such as 116). The communications link has a pair of through-board conductors (such as 172, 174) connected by a first conductive etching on one side of the PCB (such as 176). The communications link further has second etchings (such as 178, 180) on an opposite side of the PCB that respectively connect each of the through-board conductors to one of the components.

The communications link is preferably configured for use as a high speed serial communications bus, handling data transfers at a rate of one gigabits or more per second. The through-board connectors are configured for readily connecting to a connector (such as 182, 184) of a bus protocol analyzer (such as 170). Such an analyzer is useful in designing and troubleshooting complex communications such as are performed by a PCB in a distributed storage array. For example, the communications link of the present embodiments is useful in analyzing a high speed serial communications bus connecting an operating system module (such as 164) to an intelligent storage processor (such as 150).

Present embodiments further contemplate a method for analyzing the communications link on the PCB. The method includes providing the communications link between two components on the PCB having the pair of through-board conductors, such as but not limited to the vias. The through-board conductors are conductively connected by the first etching on one side of the PCB. The other pair of etchings on the opposite side of the PCB conductively connect each of the through-board conductors to one of the components. The method further includes connecting the analyzer to the through-board conductors.

The method can further include rendering the first etching nonconductive, such as by cutting or dissolving a portion of the first etching in order to open-circuit it.

The method is well suited for practicing an analysis of a high speed serial communications link, such as in the link between the operating system module and the intelligent storage processor where data packets are transferred at rates of one gigabits per second or more.

Present embodiments further contemplate a device having a PCB with a high speed serial bus and means for connecting an analyzer to a medial portion of the high speed serial bus. For purposes of the present description and meaning of the appended claims, the phrase "means for connecting" is limited to the structure described herein and equivalents thereof that permit high speed serial bus communications on the order of one gigabits per second or more.

Figure 11:
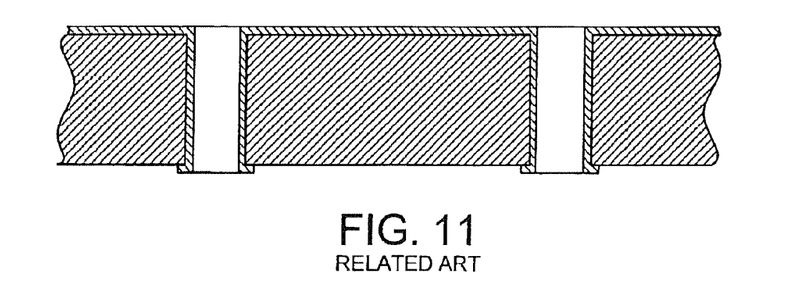
FIG. 11 is a view of a link constructed in accordance with other solutions that are not contemplated within the scope of the presently claimed embodiments.

FIG. 11 shows an illustrative PCB link construction that is expressly not contemplated by the phrase "means for connecting." In FIG. 11 all the etchings are on the same side of the PCB. This arrangement is not suited for high speed serial communications at the rates described herein because the jutting vias create transmission line stubs that will disadvantageously distort the communications at some frequencies.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular processing environment without departing from the spirit and scope of the present invention.

In addition, although the embodiments described herein are directed to a data storage array, it will be appreciated by those skilled in the art that the claimed subject matter is not so limited and various other processing systems can be utilized without departing from the spirit and scope of the claimed invention.

What is claimed is:

1. An apparatus comprising:
a printed circuit board (PCB) supporting a processor operably executing an operating system module;
an intelligent storage processor supported by the PCB;
a communications bus interconnecting the processors and having a pair of conductive vias that are not used to connect either of the processors to the PCB and that are sized to each operably engage one of a pair of probes that input data to a bus protocol analyzer, a first elongated trace extending entirely on one outer surface of the PCB interconnecting the conductive vias, and second elongated traces extending entirely on an opposite outer surface of the PCB respectively connecting each of the conductive vias to only one of the processors, the first elongated trace selectively openable to electrically isolate the two processors from each other with regard to storage communications.

2. The apparatus of claim 1 wherein the communications bus comprises a high speed serial bus.

3. The apparatus of claim 1 included in a distributed storage array.

4. The apparatus of claim 1 included in a controller passing access commands between a remote device and a storage space.

5. The apparatus of claim 4 wherein the access commands pass at a transfer rate of at least one gigabits per second.

6. An apparatus comprising:

a substrate;

a first processor attached to the substrate and a different second processor attached to the substrate; and a serial communications link operably connecting the first and second processors, the serial communications link comprising:

a pair of through-substrate conductors;

a first elongated trace connecting the first processor to one of the through-substrate conductors;

a second elongated trace connecting the second processor to the other one of the through-substrate conductors; and a third elongated trace on an external surface of the substrate connecting the pair of through-substrate conductors together, the third elongated trace selectively openable to electrically isolate the first and second processors from each other with regard to serial communications.

7. The apparatus of claim 6 wherein the first processor comprises a policy processor operably executing an operating system.

8. The apparatus of claim 7 wherein the second processor comprises an intelligent storage processor.

9. The apparatus of claim 6 included in a distributed storage array.

10. The apparatus of claim 6 included in a controller passing access commands between a remote device and a storage space.

11. The apparatus of claim 10 wherein the access commands pass at a transfer rate of at least one gigabits per second.

12. A printed circuit board assembly comprising a policy processor operably executing an operating system and connected via a serial communication bus to an intelligent storage processor, the serial communication bus including a link that is sized to selectively engage a bus protocol analyzer and that is selectively openable so that when the bus protocol analyzer is engaged all serial communications between the processors are communicated via the bus protocol analyzer.

13. The apparatus of claim 12 included in a distributed storage array.

14. The apparatus of claim 12 included in a controller passing access commands between a remote device and a storage space.

15. The apparatus of claim 14 wherein the access commands pass at a transfer rate of at least one gigabits per second.

* * * * *